United States Patent [19]

Tamura

[11] Patent Number: 4,992,387

[45] Date of Patent: Feb. 12, 1991

[54] METHOD FOR FABRICATION OF SELF-ALIGNED ASYMMETRIC FIELD EFFECT TRANSISTORS

[75] Inventor: Akiyoshi Tamura, Suita, Japan

[73] Assignee: Matsushita Electric Industrial Co., Ltd., Osaka, Japan

[21] Appl. No.: 496,300

[22] Filed: Mar. 20, 1990

[30] Foreign Application Priority Data

Mar. 27, 1989 [JP] Japan .................................. 1-75324

[51] Int. Cl.$^5$ .................... H01L 21/306; H01L 21/22
[52] U.S. Cl. ......................................... 437/41; 437/40; 437/44; 437/29; 437/984; 437/912
[58] Field of Search ...................... 437/41, 40, 44, 29, 437/984, 912

[56] References Cited

U.S. PATENT DOCUMENTS

| 4,287,660 | 9/1987 | Nicholas | 437/44 |
| 4,597,827 | 7/1986 | Nishitani et al. | 437/44 |

FOREIGN PATENT DOCUMENTS

| 0006773 | 1/1979 | Japan | 437/41 |
| 0042151 | 3/1982 | Japan | 437/44 |
| 0307739 | 12/1988 | Japan | 437/44 |

OTHER PUBLICATIONS

IBM Tech. Disclosure Bull., vol. 30, #3, Aug. 1987, p. 1136.
"A High Performance LDD GaAs MESFET with a Refractory Metal Gate", by Shuji Asai, et al., in Extended Abstract of the 18th (1986 International) Conference on Solid State Devices and Materials, Tokyo, 1986, pp. 383-386.
"A New Refractory Self-Aligned Gate Technology for GaAs Microwave Power FET's and MMIC's", by Arthur E. Geissberger, ICCC Transactions on Electron Devices, vol. 35, No. 5, May 1988, pp. 615-622.

Primary Examiner—Brian E. Hearn
Assistant Examiner—Gordon V. Hugo
Attorney, Agent, or Firm—Stevens, Davis, Miller & Mosher

[57] ABSTRACT

A method for fabrication of a field effect transistor includes forming an insulator film of a proper thickness at a predetermined region on one principal surface of a compound semiconductor substrate, forming a gate electrode of a refractory metal on a side wall of the insulator film in a self-alignment manner, and implanting ions with a mask of the insulator film and the gate electrode to form ion implanted regions in the substrate asymmetrically with respect to the gate electrode.

4 Claims, 8 Drawing Sheets

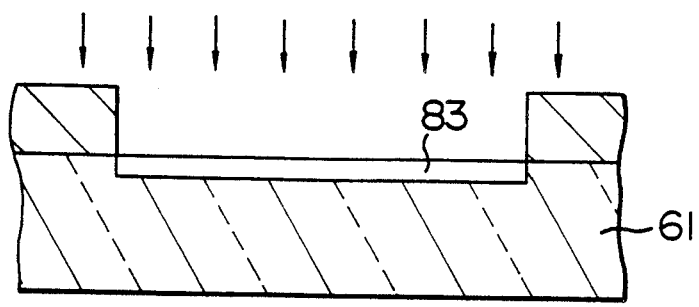
FIG. 5a
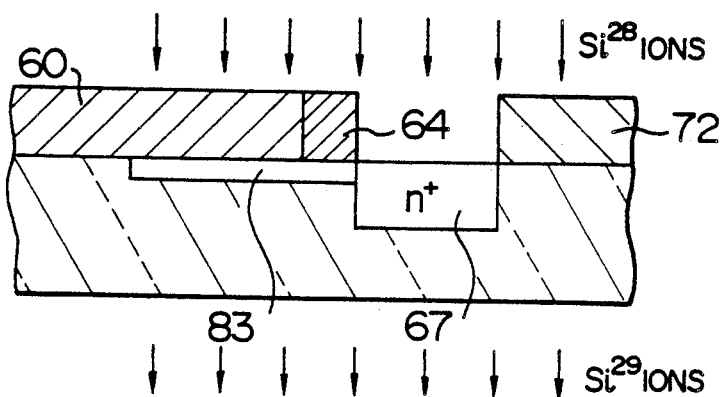
FIG. 5e
FIG. 5f
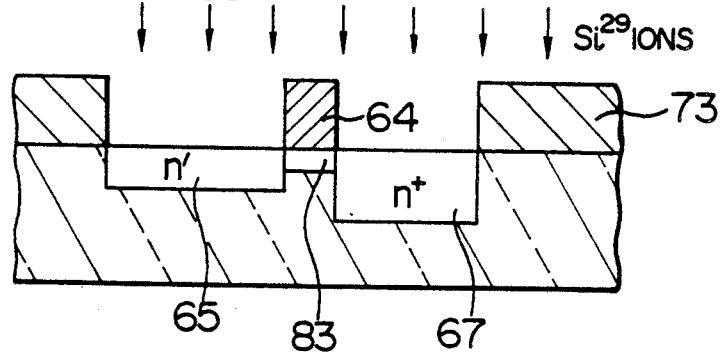
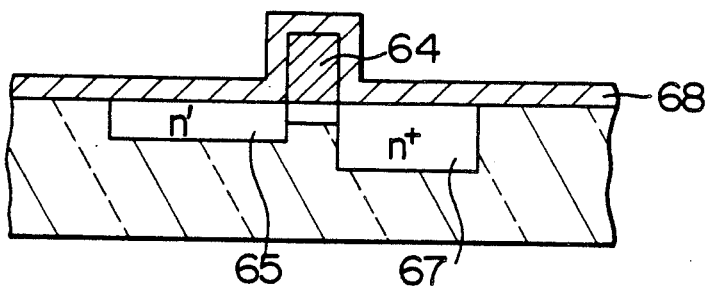
FIG. 5g
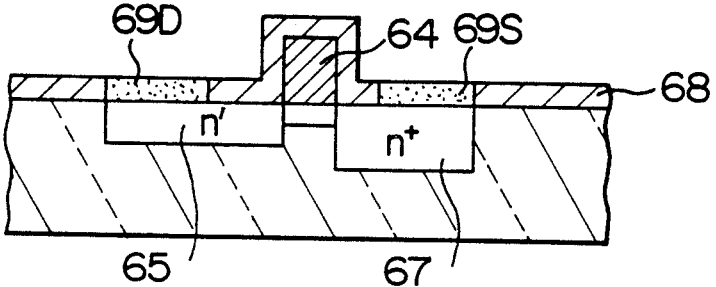
FIG. 5h

METHOD FOR FABRICATION OF SELF-ALIGNED ASYMMETRIC FIELD EFFECT TRANSISTORS

BACKGROUND OF THE INVENTION

The present invention relates to a method for fabrication of a field effect transistor using a compound semiconductor.

The following explanation will be made taking a GaAs metal-semiconductor field effect transistor (hereinafter referred to as MESFET) as an example.

In order to suppress the fluctuations of a threshold voltage of a GaAs MESFET formed on a semi-insulating GaAs substrate and thereby to implement the improvement of performance including the reduction of a source resistance, there is widely employed a self-alignment FET in which n+ source and drain regions are formed through ion implantation and in self-alignment with a refractory metal gate. In recent years, there has been developed a GaAs MESFET called LDD (lightly doped drain) structure which includes a medium impurity concentration implanted layer called an n' layer between an implanted well layer and a usual n+ implanted layer and n' layer has an impurity concentration lower than that of the n+ layer, thereby improving a drain breakdown voltage. FIGS. 1a to 1g show a method for fabrication of an enhancement mode FET which is a typical example of such an LDD GaAs MESFET.

As shown in FIG. 1a, $Si^{29}$ ions are selectively implanted at 30 KeV with a dose of $2.5 \times 10^{12}$ cm$^{-2}$ into one principal surface of a semi-insulating GaAs substrate 1 with a photoresist film 2 used as a mask, thereby forming an active layer 3. Next, as shown in FIG. 1b, a WSi$_{0.6}$ film 18 (having a thickness of 2000 Å) is formed on the entire surface of the structure through a sputtering method after removal of the photoresist film and a photolithography method is thereafter used to form a photoresist film 19 on a region which is to serve as a gate. Then, as shown in FIG. 1c, the WSi$_{0.6}$ film 18 is subjected to anisotropic dry etching by use of a CF$_4$ gas and with the photoresist film 19 used as a mask and the photoresist film mask is removed, thereby providing a gate electrode 4. Thereafter, as shown in FIG. 1d, a photoresist film 13 is formed and $Si^{29}$ ions are implanted at 50 KeV with a dose of $6 \times 10^{12}$ cm$^{-2}$ into predetermined regions from the upside of the gate electrode with the photoresist film 13 used as a mask to form n' layers 5. In this case, the $Si^{29}$ ions are not implanted into the active layer 3 just under the gate electrode 4.

Next, the photoresist film 13 is removed and an SiO$_2$ film 6 having a thickness of 2000 Å is thereafter formed on the entire surface of the resultant structure by means of a plasma enhanced CVD method, as shown in FIG. 1e. Then, a photoresist film 14 is deposited and $Si^{28}$ ions are implanted at 160 KeV with a dose of $5 \times 10^{13}$ cm$^{-2}$ into predetermined regions through the SiO$_2$ film 6 with the photoresist film 14 used as a mask to form n+ layers 7. In this case, since the SiO$_2$ film on the side wall portion of the gate electrode is thick so that the $Si^{28}$ ions are not implanted into the GaAs substrate, the n+ layer 7 is formed at a distance of the side wall width L$_s$ from the gate electrode. Next, the photoresist film 14 and the SiO$_2$ film 6 are removed by use of a buffer HF solution or the like and an SiO$_2$ film 8 is thereafter deposited with a thickness of about 1000 Å on the surface of the structure by means of a thermal CVD method, as shown in FIG. 1f. The resultant structure is annealed at 800° C. for 20 minutes in an Ar/AsH$_3$ atmosphere, thereby activating the ion implanted regions. Next, as shown in FIG. 1g, predetermined portions of the SiO$_2$ film 8 are opened to form therein ohmic electrodes 9 made of AuGeNi, thereby completing an FET.

However, in the conventional FET having the above-mentioned structure, since the n' and n+ implanted layers 5 and 7 serving as a source and a drain are formed symmetrically with respect to the gate electrode, there is a problem that an approach to further reduction in source resistance (R$_s$) and to increase in transconductance (g$_m$) causes the deterioration of a drain breakdown voltage and the increase of a drain conductance (g$_d$) and a gate-drain capacitance (C$_{gd}$), thereby deteriorating a high frequency characteristic and a drain voltage (V$_d$) margin of the FET.

An example in which an asymmetric source/drain structure is provided in order to avoid the above-mentioned problem is shown in FIG. 4. FIG. 2 shows a fabrication process step substituted for the step of FIG. 1e in which the n+ layer 7 is formed. $Si^{28}$ ions are implanted using a photoresist film 22 in such a manner that it selectively covers only a drain region in a manual alignment manner. Thereby, an n' implanted layer 25 and an n+ implanted layer 27 asymmetric with respect to gate electrode 24 are formed by the help of the photoresist film 22 partially provided on the surface. A source and a drain formed by the n' implanted layer 25 and the n+ implanted layer 27 can be individually adjusted so as to reduce a source resistance and to increase a transconductance. However, a control is required so that the position of an end portion R$_e$ of the photoresist film falls within a range of L$_R$ across the gate electrode 24, as shown in FIG. 2. Fine delineation of the FET encounters problems such as residue of resist in the source region and deviation of the mask relative to the electrode 24 having a short gate length.

SUMMARY OF THE INVENTION

An object of the present invention is to provide a method for fabrication of a short gate length FET in which the improvement of a drain breakdown voltage and the reduction of a gate-drain capacitance (C$_{gd}$) are attained with no deterioration of a transconductance (g$_m$), thereby improving a high frequency characteristic and a drain voltage (V$_d$) margin of the FET.

To achieve the above object, a method for fabrication of an FET according to the present invention includes forming a gate electrode by means of a self-alignment technique on one side wall of an insulator film partially provided on a substrate surface, and implanting ions into the resultant substrate surface structure using as a mask the insulator film and the gate electrode to implant into a substrate surface region, thereby forming a source and drain regions which have an asymmetric structure.

BRIEF DESCRIPTION OF THE DRAWINGS

FIGS. 4a to 4h show similar views of a simplified method according to the second embodiment of the present invention;

FIGS. 5a to 5h show similar views according to the third embodiment of the present invention;

DESCRIPTION OF THE PREFERRED EMBODIMENTS

FIGS. 3a to 3h show a first embodiment of the present invention.

Figure 1A:
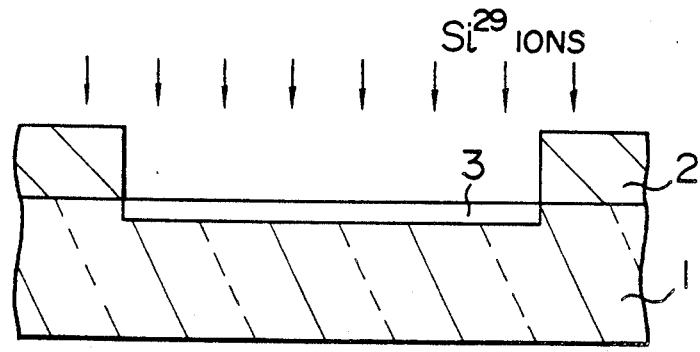
FIGS. 1a to 1g show, in cross section, successive process steps for fabrication of the conventional GaAs MESFET having a symmetric source/drain structure.
Figure 1B:
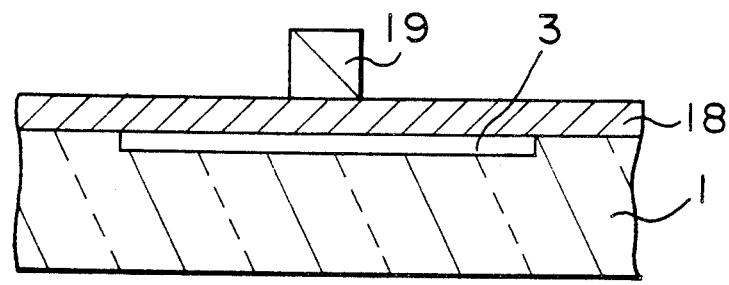
Figure 1C:
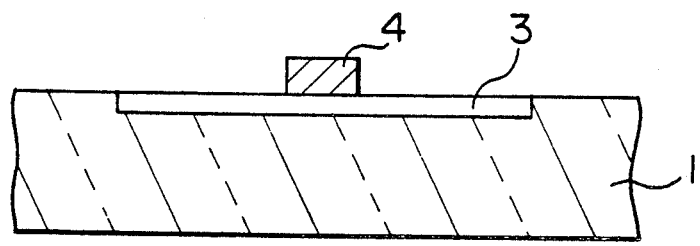
Figure 1D:
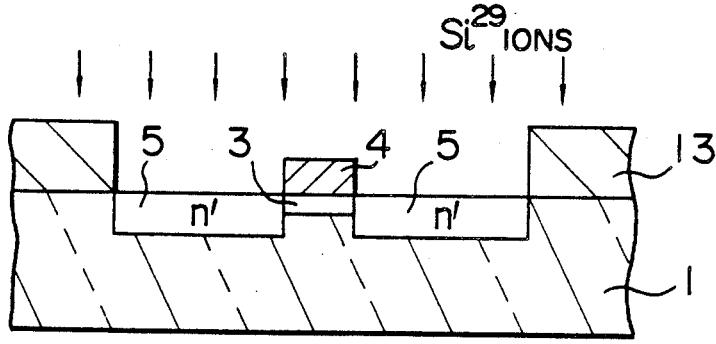
Figure 1E:
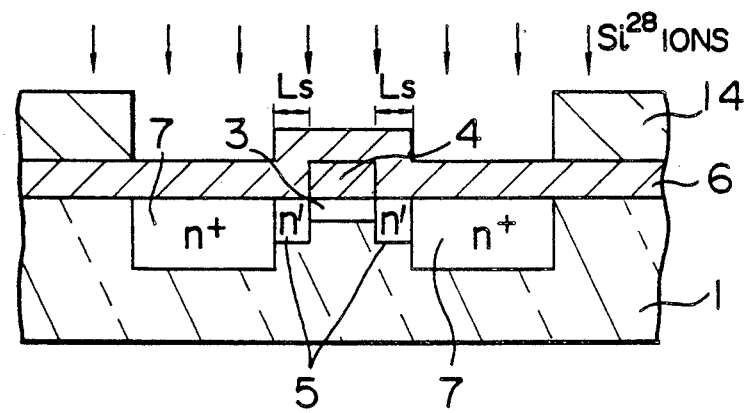
Figure 1F:
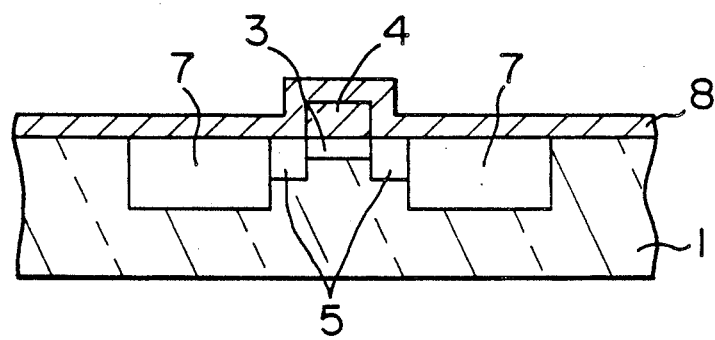
Figure 1G:
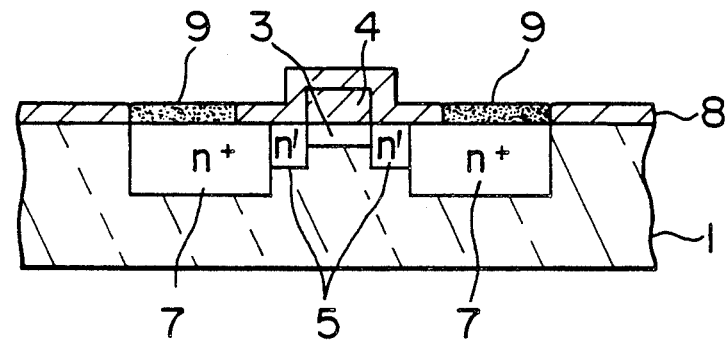
Figure 2:
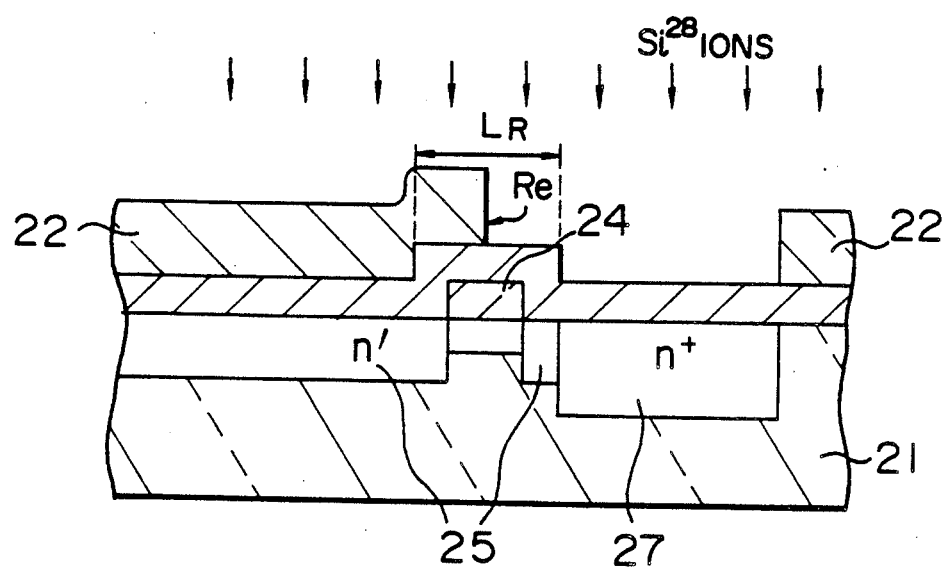
FIG. 2 shows in cross section a process step for fabrication of the conventional GaAs MESFET having an asymmetric source/drain structure.
Figure 3A:
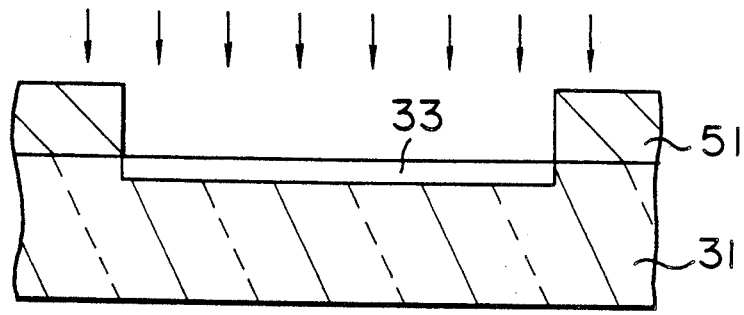
FIGS. 3a to 3h show sectional views of steps of a method for producing GaAs MESFET according to the first embodiment of the present invention.
Figure 3B:
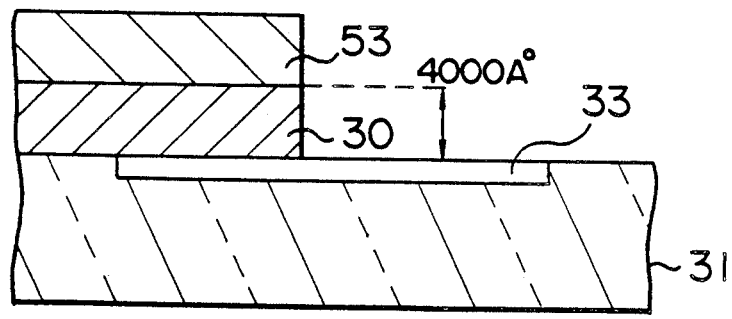

As shown in FIG. 3a, $Si^{29}$ ions are selectively implanted into at 30 KeV with a dose of $2.5 \times 10^{12}$ cm$^{-2}$ into one principal surface of a semi-insulating GaAs substrate 31 with a photoresist film 51 used as mask, thereby forming an active layer 33. Next, as shown in FIG. 3b, an SiO$_2$ film 30 having a thickness of 4000 Å is deposited on the entire surface of the structure after removal of the photoresist film 51 and a predetermined portion of the SiO$_2$ film is thereafter removed with a photoresist film 53 used as a mask and by means of reactive ion etching of a CF$_4$ gas, thereby leaving the SiO$_2$ film 30 at only a certain region. In this case, one side surface of the SiO$_2$ film is substantially perpendicular to the principal surface of the substrate 31.

Figure 3C:
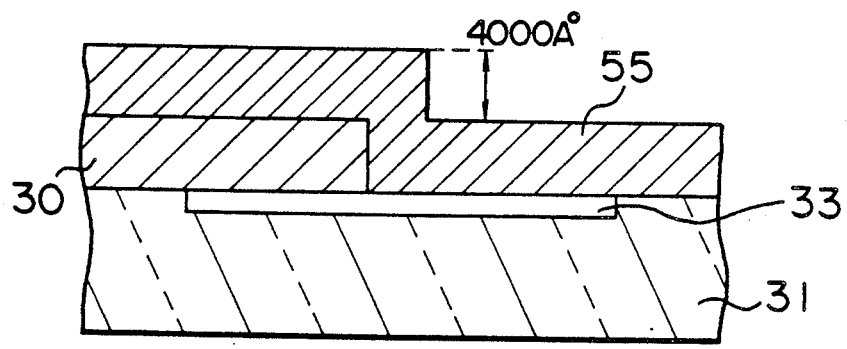
Figure 3D:
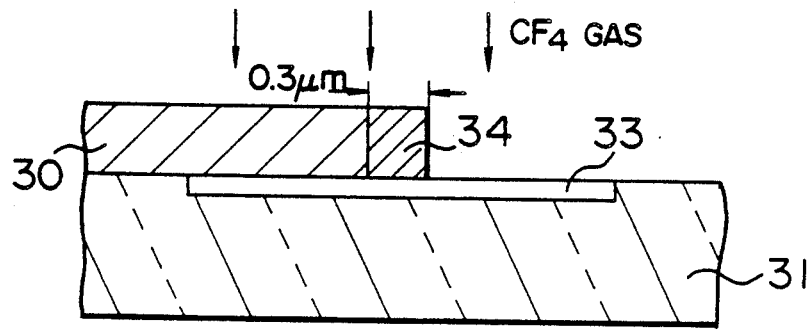

Next, as shown in FIG. 3c, the photoresist film 53 is removed and a WSi$_{0.6}$ film 55 having a thickness of 4000 Å is thereafter deposited on the entire surface of the structure by means of a sputtering method. Then, as shown in FIG. 3d, vertical etching is conducted by use of reactive ion etching of an CF$_4$ gas so as to leave only the WSi$_{0.6}$ film which is present on the side surface of the SiO$_2$ film 30 and is to serve as a gate electrode 34. Thus, a gate length is defined by the thickness of the WSi$_{0.6}$ film which is left on the side wall of the SiO$_2$ film 30 and is on the order of about 75% of the thickness of the WSi$_{0.6}$ film which was deposited on the entire surface of the structure in the step shown in FIG. 3c. In the shown embodiment, since the WSi$_{0.6}$ film of 4000 Å was deposited, the gate length is about 0.3 μm. Thus, it is possible to easily provide a gate length on the order of submicron.

Figure 3E:
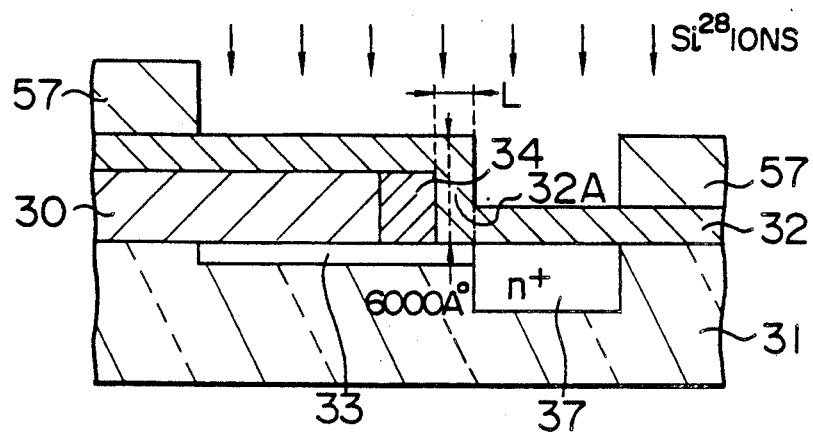
Figure 3F:
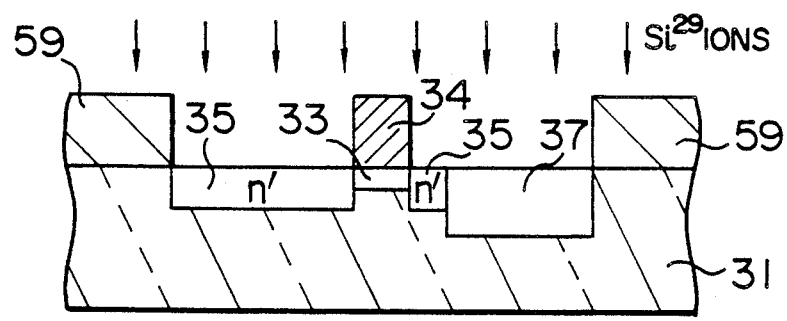
Figure 3G:
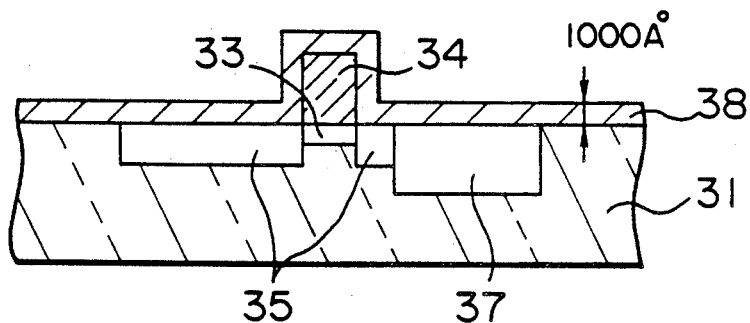
Figure 3H:
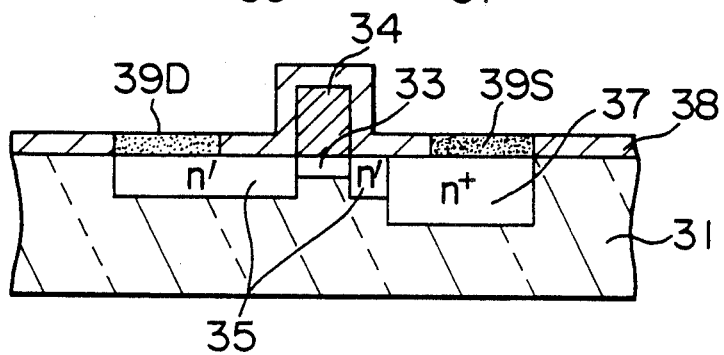

Next, as shown in FIG. 3e, an SiO$_2$ film 32 having a thickness of 2000 Å is formed on the entire surface of the resultant structure and $Si^{28}$ ions are thereafter implanted at 160 KeV with a dose of $5 \times 10^{13}$ cm$^{-2}$ into a predetermined region with a photoresist film 57 used as a mask. Under this condition of implantation, $Si^{28}$ ions pass through SiO$_2$ film 32 of a thickness of 2000 Å to form a heavy doped n+ layer 37. However, a SiO$_2$ film portion 32A formed at the end edge portion of the gate electrode 34 and the left side portion inclusive of SiO$_2$ film 30 have a thickness of 6000 Å. Accordingly the implanted $Si^{28}$ ions do not reach until the GaAs substrate 31 directly under the thick SiO$_2$ film portion 32A as well as under the SiO$_2$ film 30. Namely the $Si^{28}$ ions are not implanted into the substrate under these portions. As a result, the heavy doped n+ layer 37 is formed in a region of the GaAs substrate 31 on one side of the gate electrode 34 (that is, a region on the right side of the gate electrode in FIG. 3e on which the SiO$_2$ film 30 is not provided). Next, as shown in FIG. 3f, all of the SiO$_2$ films are removed by use of an etchant including an HF solution and $Si^{29}$ ions are thereafter implanted at 50 KeV with a dose of $6 \times 10^{12}$ cm$^{-2}$ with a photoresist film 59 used as a mask to form a lightly doped n' layer 35. Then, as shown in FIG. 3g, the photoresist film is removed, an SiO$_2$ film 38 having a thickness of 1000 Å is deposited again on the entire surface of the resultant structure by use of a CVD method, and the structure is annealed at 800° C. for 20 minutes in an Ar/AsH$_3$ atmosphere to activate the ion implanted layers. Thereafter, as shown in FIG. 3h, metal electrodes, which may be made of AuGeNi are formed on predetermined regions by use of a lift-off method and are sintered at 450° C. for 3 minutes in an argon atmosphere to form ohmic electrodes 39. The heavy doped n+ layer 37 serves as a source region and the lightly doped n' layer 35 serve as a drain region.

FIGS. 4a to 4g show a main part of a second embodiment including modified steps in which the formation of the SiO$_2$ film 32 shown in FIG. 3e in the above-mentioned first embodiment is omitted but an FET is formed with ion implantation conducted once. Similarly, FIGS. 5a to 5h show a main part of a third embodiment in which the formation of the SiO$_2$ film 32 is omitted but an FET is formed with ion implantation conducted twice.

Figure 4A:
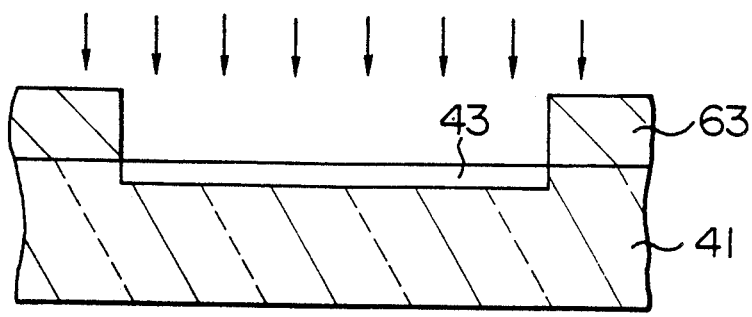
Figure 4D:
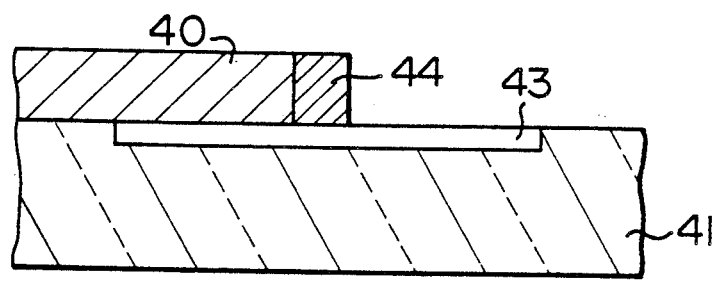
Figure 4E:
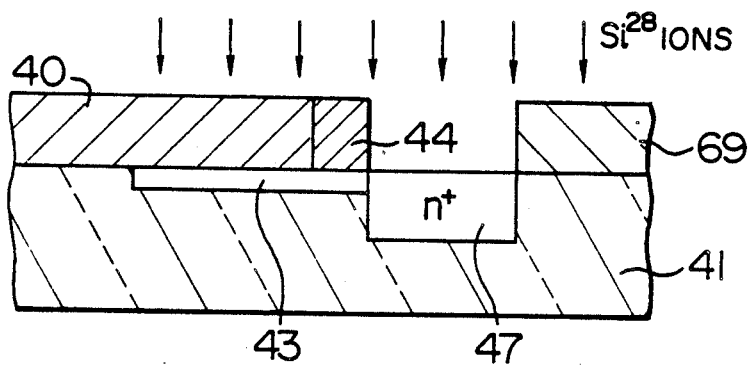
Figure 4F:
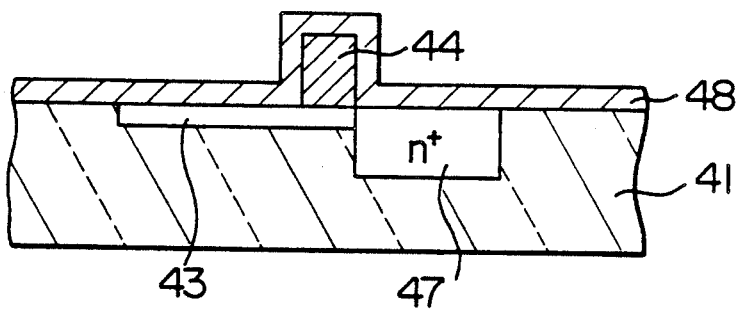

According to the second embodiment, SiO$_2$ film 40, active layer (implanted well layer) 43 and gate electrode 44 are formed on GaAs substrate 41 of FIG. 4d by steps similar to those of FIGS. 3a to 3d. Next, as shown in FIG. 4e, $Si^{28}$ ions are implanted (100 KeV, $3 \times 10^{13}$/cm$^2$) into exposed surface portions adjacent to the electrode 44 of the substrate by using as masks the SiO$_2$ film 40, gate electrode 44 and photoresist 69 in order to form an n+ layer 47 for formation of a source region. Despite this ion implantation, active layer 43 is not affected and maintained to form drain and channel regions. Further, similarly to steps of FIGS. 3g to 3h, SiO$_2$ film 48 is deposited with a thickness of 1000 Å entirely over the resultant substrate surface structure by a thermal CVD method as shown in FIG. 4f after removing photoresist film 69, and the ion implanted layer is annealed and activated at 800° C. for 20 minutes. Finally source electrode 49S and drain electrode 49D are formed.

According to FIGS. 5a to 5e of the third embodiment, SiO$_2$ film 60, active layer (implanted well layer) 83, gate electrode 64 and photoresist film 72 are formed at GaAs substrate 61 similarly to the step shown in FIG. 4e, and $Si^{28}$ ions are implanted (100 KeV, $3 \times 10^{13}$/cm$^2$) to form n+ layer 67 in the substrate surface portion.

Further, similarly to the step of FIG. 3f, $Si^{29}$ ions are implanted (50 KeV, $6 \times 10^{12}$/cm$^2$) with a mask of the gate electrode 64 and photoresist film 73 formed after removing the SiO$_2$ film 60 and photoresist film 72 in order to form a lightly doped n' layer 65 as shown in FIG. 5f. Despite this ion implantation, the portion of the active layer 83 under the gate electrode 64 is not affected and maintained. n+ layer 65 and n+ layer 67 form drain and source regions of the FET respectively. Next, similarly to steps of FIGS. 3g and 3h, SiO$_2$ film 68 is deposited with a thickness of 1000 Å entirely over the resulting substrate surface structure, and drain electrode 69D and source electrode 69S are formed after the annealing step for the substrate structure.

Figure 4G:
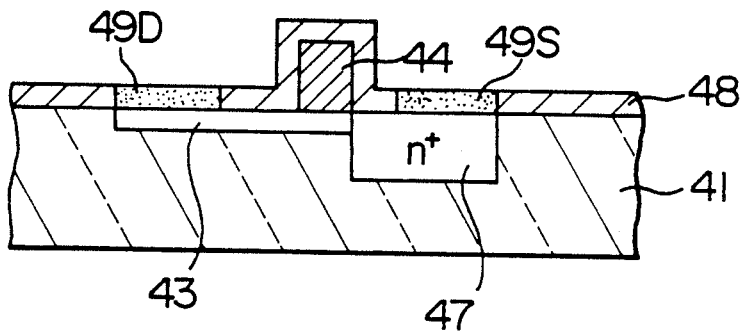

As apparent from the last structures of the first to third embodiments as shown in FIGS. 3h, 4g and 5h, three kinds of different asymmetrical FET structures are achieved. Among these structures, the FET structure of the first embodiment shown in FIG. 3h is preferred from the viewpoint of schottky breakdown voltage, this owing to the formation of the n+ layer 37 isolated from the gate electrode 34. Namely, by the step of FIG. 3e to form the SiO$_2$ film 32 over the upper portion of the substrate before implanting Si$^{28}$ ions to form n+ layer 37, the SiO$_2$ portion 32A is formed with a thickness of 6000 Å on the right side of the gate electrode 34 as shown in FIG. 3e. This portion 32A serves as a side wall, and the n+ layer 37 is not formed immediately under the portion 32A. Consequently the n+ layer 37 is formed distantly away by a distance L from the gate electrode.

The following tables (1) and (2) compare FET structure of the first to third embodiments.

TABLE (1)

|  | FET structure | | | Number of Ion implantation |
|---|---|---|---|---|
|  | Drain | Channel | Source |  |
| 1st embodiment | n' layer | active layer | n+/n' layers | two (n+, n') |
| 2nd embodiment | active layer | (") | n+layer | one (n+) |
| 3rd embodiment | n' layer | (") | n+layer | two (n+, n') | n+: heavily doped layer
n': lightly doped layer

TABLE (2)

|  | Ion Implantation | | |
|---|---|---|---|
|  | Well implantation | n+implantation | n' implantation |
| 1st embodiment | (Si$^{29}$, 30 KeV, 2.5 × 10$^{12}$/cm$^2$) | Si$^{28}$, 160 KeV, 5 × 10$^{13}$/cm$^2$ | (Si$^{29}$, 50 Kev, 6 × 10$^{12}$/cm$^2$) |
| 2nd embodiment | Well implantation (Si$^{29}$, 30 Kev, 2.5 × 10$^{12}$/cm$^2$) | n+implantation (Si$^{28}$, 100 KeV, 3 × 10$^{13}$/cm$^2$) | No |
| 3rd embodiment | Well implantation (Si$^{29}$, 30 KeV, 2.5 × 10$^{12}$/cm$^2$) | n+implantation (Si$^{28}$, 100 KeV, 3 × 10$^{13}$/cm$^2$) | n' implantation (Si$^{29}$, 50 KeV, 6 × 10$^{12}$/cm$^2$) |

Figure 6:
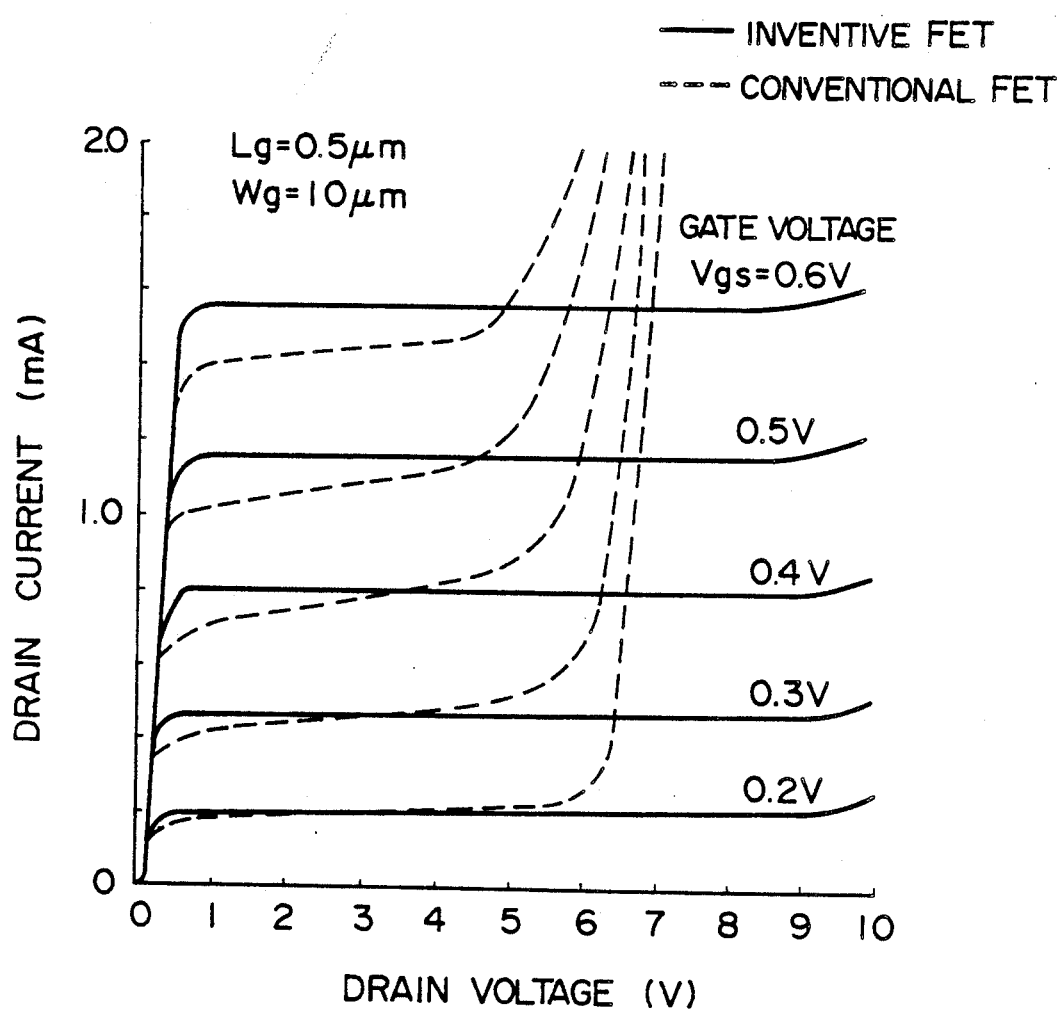
FIG. 6 is a graph comparatively showing static I-V characteristics of GaAs MESFETs fabricated according to the first embodiment and the conventional method.

FIG. 6 comparatively show static I-V characteristics of an FET with an asymmetric structure fabricated according to the first embodiment of the present invention and an FET with a symmetric structure fabricated according to the conventional method shown in FIGS. 1a to 1g. Each FET has a gate length of 0.5 μm and a gate width of 10 μm. As apparent from the figure, the FET according to the fabrication method of the present invention has a large drain breakdown voltage and a small drain conductance ($g_d$) as compared with the FET according to the conventional fabrication method. Also, transconductance ($g_m$) of the inventive FET and the conventional FET are substantially the same or have no substantial difference therebetween. The difference in characteristic between the inventive FET and the conventional FET originates from the fact that the inventive FET including an n+ layer formed only on the source side has a source resistance and a drain resistance which are respectively the same as and larger than those of the conventional FET in which n+ layers on the source and drain sides are symmetrical.

The foregoing explanation has been made taking the GaAs MESFET as an example. Needless to say, the present invention is applicable to a hetero-structure device such as HEMT which utilizes a two-dimensional electron gas or hole gas as an active layer. Also, though SiO$_2$ has been used as the insulator film, the other insulator film such as an SiN film may be used. Further, for the gate electrode may be made of the other refractory metal such as WN or WSiN.

As has been explained above, according to a fabrication method of the present invention, an FET having a structure in which ion implanted regions on the source and drain sides are asymmetrical can be fabricated in a self-alignment manner. As a result, the improvement of a drain breakdown voltage and the reduction of a drain conductance ($g_d$) can be attained without deteriorating a transconductance ($g_m$). Also, the present invention can cope with a shorter gate length and can provide a shorter gate since the gate length is determined by the thickness of a gate metal film formed on the side wall of an insulator film.

I claim:

1. A method for fabrication of a field effect transistor comprising:

a step of forming an active layer in a principal surface portion of a compound semiconductor substrate;

a step of forming an insulator film to cover an upper surface portion of said active layer;

a step of forming a conductor film on said substrate and said insulator film and removing selectively said conductor film through etching in a vertical direction so that a gate electrode comprising a portion of said conductor film is formed on an end portion of said insulator film in a self-alignment manner; and a step of conducting ion implantation for formation of a source region with said insulator film and said gate electrode used as masks to form a region of a high impurity concentration in a portion of said substrate on an unmasking side of said gate electrode so that source and drain regions comprising said region of said high impurity concentration and said active layer and having different impurity concentrations are formed in said substrate on opposite sides of said gate electrode.

2. A method for fabrication of a field effect transistor comprising:

a step of forming an active layer in a principal surface portion of a compound semiconductor substrate;

a step of forming an insulator film to cover an upper surface portion of said active layer;

a step of forming a conductor film on the resulting surface portion of said substrate and said insulator film and removing selectively said conductor film through etching in a vertical direction so that a gate electrode comprising a portion of said conductor film is formed on an end portion of said insulator film in a self-alignment manner;

a step of conducting first ion implantation for formation of a source region with said insulator film and said gate electrode used as masks so that a first impurity concentration region is formed in a portion of said substrate on unmasked side of said gate electrode; and a step of removing said insulator film and conducting second ion implantation for formation of a drain region with said gate electrode used as a mask so that a second impurity concentration region is formed in a portion of said substrate to thereby form the source region and a drain region having the first and second different impurity concentrations respectively in said substrate on opposite sides of said gate electrode.

3. A method for fabrication of a field effect transistor comprising:

a step of forming an active layer in a principal surface portion of a compound semiconductor substrate;

a step of forming a first insulator film to cover an upper surface portion of said active layer;

a step of forming a conductor film on the resulting surface portion of said substrate and said first insulator film and removing selectively said conductor film through etching in a vertical direction so that a gate electrode comprising a portion of said conductor film is formed on an end potion of said first insulator film in a self-alignment manner;

a step of forming a second insulator film on said first insulator film, said gate electrode and said substrate to thereby form a thick insulator portion of said second insulator film on exposed side wall portion of said gate electrode;

a step of conducting first ion implantation for formation of a source region with said first insulator film, said gate electrode and said second insulator film thick portion used as masks so that a high impurity concentration region is formed in a portion of said substrate on unmasked side of said gate electrode; and a step of removing said first and second insulator films and conducting second ion implantation for formation of a drain region with said gate electrode used as a mask so that a low impurity concentration region is formed in a portion of said substrate to thereby form the source region and drain region having different impurity concentrations in said substrate on opposite sides of said gate electrode.

4. A method according to claim 3, wherein said source region and said drain region are formed of said high and said low impurity concentration regions respectively, a portion of said active layer is formed under said gate electrode, and a portion of said low impurity concentration region is formed under said second insulator film thick portion and between said source region and said portion of said active layer.

* * * * *